United States Patent
Zanolli et al.

(10) Patent No.: US 8,096,464 B2
(45) Date of Patent: Jan. 17, 2012

(54) SOLDER-BEARING ARTICLES AND METHOD OF RETAINING A SOLDER MASS ALONG A SIDE EDGE THEREOF

(75) Inventors: James Zanolli, North Smithfield, RI (US); Joseph Cachina, Warwick, RI (US)

(73) Assignee: Teka Interconnection Systems, Warwick, RI (US)

( * ) Notice: Subject to any disclaimer, the term of this patent is extended or adjusted under 35 U.S.C. 154(b) by 244 days.

(21) Appl. No.: 12/303,083

(22) PCT Filed: May 31, 2007

(86) PCT No.: PCT/US2007/070048
§ 371 (c)(1),
(2), (4) Date: May 21, 2009

(87) PCT Pub. No.: WO2007/140448
PCT Pub. Date: Dec. 6, 2007

(65) Prior Publication Data
US 2010/0067209 A1  Mar. 18, 2010

Related U.S. Application Data

(60) Provisional application No. 60/810,032, filed on May 31, 2006.

(51) Int. Cl.
*B23K 35/14* (2006.01)

(52) U.S. Cl. ................ 228/180.22; 228/33; 228/56.3

(58) Field of Classification Search .................. 228/178, 228/179.1, 180.1, 180.21, 180.22, 245, 246, 228/249
See application file for complete search history.

(56) References Cited

U.S. PATENT DOCUMENTS

| | | | | |
|---|---|---|---|---|
| 4,302,067 A | * | 11/1981 | Monson et al. | 439/876 |
| 4,705,205 A | * | 11/1987 | Allen et al. | 228/180.22 |
| 4,712,721 A | | 12/1987 | Noel et al. | |
| 5,747,101 A | | 5/1998 | Booth et al. | |
| 6,095,397 A | | 8/2000 | Wolf et al. | |
| 6,534,726 B1 | | 3/2003 | Okada et al. | |
| 2001/0045009 A1 | * | 11/2001 | Cachina et al. | 29/840 |
| 2004/0074950 A1 | * | 4/2004 | Grieder et al. | 228/180.22 |

FOREIGN PATENT DOCUMENTS

CN  1305338  7/2001

* cited by examiner

*Primary Examiner* — David Sample
*Assistant Examiner* — Megha Mehta
(74) *Attorney, Agent, or Firm* — Weingarten, Schurgin, Gagnebin & Lebovici LLP

(57) ABSTRACT

A method and device for depositing a solder mass within a plated opening that is formed in a side edge of an electronic device includes the steps of carrying the solder mass in a carrier device and orienting the carrier device with respect to the side edge such that the solder mass is aligned with the plated opening. The method further includes reflowing the solder mass to cause the solder mass to be deposited and securely held within the plated opening and then removing the carrier device leaving the solder mass behind within the plated opening and along the side edge of the electronic device.

17 Claims, 3 Drawing Sheets

SOLDER-BEARING ARTICLES AND METHOD OF RETAINING A SOLDER MASS ALONG A SIDE EDGE THEREOF

CROSS REFERENCE TO RELATED APPLICATION

The present application is a U.S. National Phase application under 35. U.S.C. §371 of International Application No. PCT/US2007/070048, filed on May 31, 2007, and claims the benefit of U.S. patent application No. 60/810,032, filed May 31, 2006, both of which are hereby incorporated by reference in their entirety. The International Application was published in English on Dec. 6, 2007 as WO 2007/140448 A2 under PCT Article 21(2).

TECHNICAL FIELD

The present invention relates generally to solder-bearing articles, such as devices used for joining electronic components to one another, electrical leads, terminals, electromagnetic shields, and furthermore, to a method for retaining a solder mass along a side edge of the solder-bearing article.

BACKGROUND

It is often necessary and desirable to electrically connect one component to another component. For example, a multi-terminal component, such as a connector, is often electrically connected to a substrate, such as a printed circuit board, so that the contacts or terminals of the component are securely attached to contact pads formed on the substrate to provide an electrical connection therebetween. One preferred technique for securely attaching the component terminals to the contact pads is to use a solder material.

In the electronic equipment industry, an important necessity is the rapid and accurate assembly of leads, terminals and contacts with contact pads of printed circuit boards (PCB) and other substrates. For convenience of connecting such elements, it has previously been disclosed to facilitate the soldering of their connection by securing a solder slug or mass to one of the elements so that, when positioned in engagement with the other element and heated, the molten solder will cover the adjacent surfaces of both elements to form when cooled a solder joint providing both a mechanical coupling and an electrical connection between the elements.

One disadvantage of using solder masses is that the solder masses first have to be formed to have the proper dimensions and then the solder masses have to be coupled to solder-holding elements (e.g., solder clips) before the solder reflow operation is performed. This can be a very time consuming and difficult task depending upon the construction of the element that receives the solder, such as a PCB.

In addition, the construction of some PCBs makes it difficult to electrically connect one planar contact of one PCB to another planar contact of another PCB as is the case when the contacts overlie one another at least partially.

SUMMARY

One embodiment of the invention is directed to a method of depositing a solder mass within a plated opening that is formed in a side edge of an electronic device includes the steps of holding the solder mass in a carrier device and orienting the carrier device with respect to the side edge such that the solder mass is aligned with the plated opening. The method may also include reflowing the solder mass to cause the solder mass to be deposited and securely held within the plated opening and then removing the carrier device leaving the solder mass behind within the plated opening along the side edge of the electronic device.

The electronic device includes a conductive area, such as a solder pad, that is formed on one face or surface thereof that intersects the side edge at a right angle. The plated opening in the side edge of the electronic device intersects the conductive area and thus provides a means for electrically conducting the conductive area to another conductive area, such as another solder pad, associated with another electronic device.

Other features and advantages of the present invention will be apparent from the following detailed description when read in conjunction with the accompanying drawings.

BRIEF DESCRIPTION OF THE DRAWINGS

The foregoing and other features of the present invention will be more readily apparent from the following detailed description and drawings of illustrative embodiments of the invention in which.

DETAILED DESCRIPTION

As described and illustrated herein, one exemplary solder-bearing article according to the present invention is in the form of a solder-bearing component for use in electrical applications.

Figure 1:
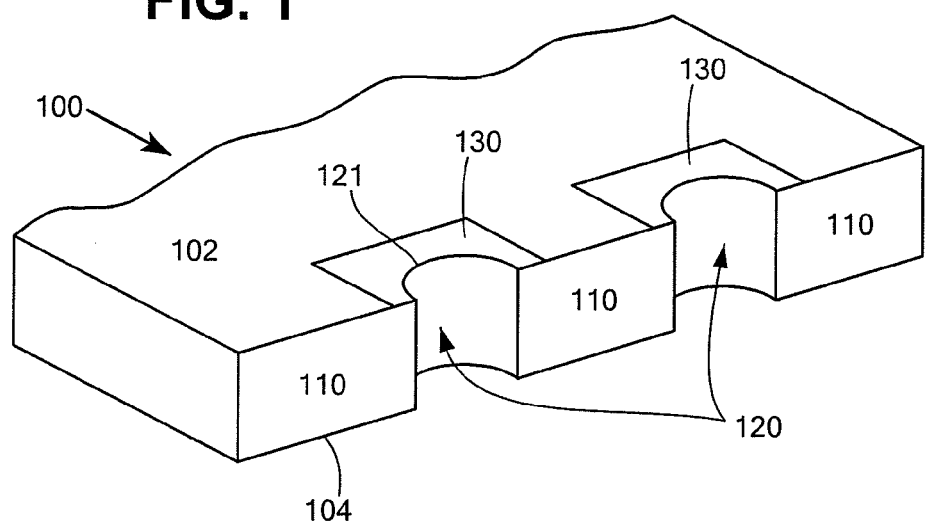
FIG. 1 is a perspective view of a printed circuit board (PCB) that has a bisected plated opening formed on an edge of the PCB with a solder pad being connected thereto.

FIG. 1 illustrates a solder bearing article 100 in the form of a printed circuit board (PCB) that has a top surface 102 and an opposite bottom surface 104, as well as a peripheral edge (side edge) 110 that extends between the top and bottom surfaces 102, 104 and defines a thickness of the PCB 100. Typically, the PCB 100 has a generally square or rectangular shape; however, other shapes are equally possible. The illustrated PCB 100 is a plated, solderable structure in that the PCB 100 includes at least one and preferably a plurality of plated openings 120. In contrast to common PCB design, the plated openings 120 according to the present embodiment are formed along one or more edges 110 of the PCB 100. For purpose of illustration only, the illustrated embodiment shows the plated openings 120 formed in one side edge 110 of the PCB 100; however, it will be understood that the plated openings 120 can be formed in more than one of the edges 110.

In the illustrated embodiment, the plated openings 120 are perpendicular bisected plated opening 120 in that the PCB 100 includes solder pads 130 that are connected to the perpendicularly bisected plated openings 120. The solder pads 130 can be conventional solder pads; however, the solder pads 130 are arranged on the top surface 102 such that they are orientated perpendicular to the plated openings 120 and such that they intersect the plated openings 120 at a right angle. Each plated opening 120 defines a channel that extends from the bottom surface 104 to the top surface 102 and in the illustrated embodiment, the plated opening 120 has an arcuate surface, such as a semi-circular shaped channel in that it is not a completely closed hole formed through the substrate. The opening 120 is thus an elongated channel formed along the side edge 110.

The solder pads 130 can have any number of different shapes so long as they are electrically connected to the plated openings 120. In other words, the solder pads 130 intersect the plated openings 120. Since the plated opening 120 has an arcuate shape, the solder pad 130 has an arcuate shaped edge 121 where it intersects the plated opening 120. The remaining, surrounding shape of the solder pad 130 can be a regular shape, such as a square or rectangle. In the illustrated embodiment, the solder pad 130 has a square shape except for the arcuate shaped edge 121 at the edge 110.

Typically, one solder pad 130 is electrically connected to one plated opening 120.

Figure 2:
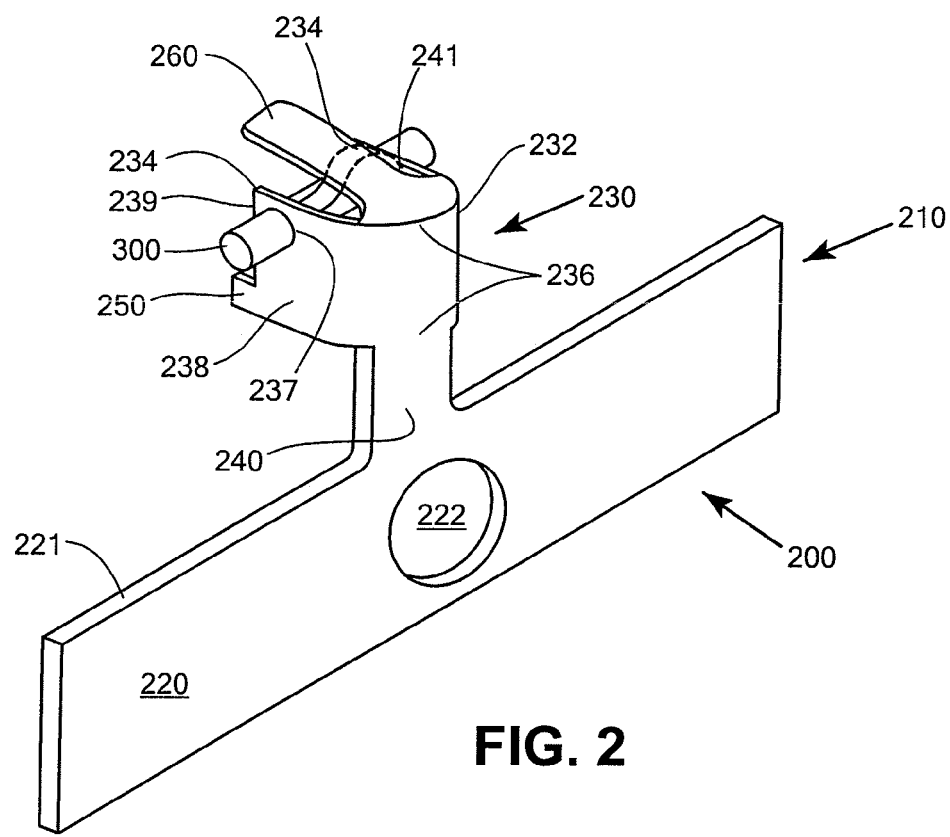
FIG. 2 is a perspective view of a carrier that is constructed to hold and align a solder mass for placement in the bisected plated opening of the PCB of FIG. 1.

Now referring to FIG. 2 in which a carrier 200 for holding a solder mass 300 is provided; the carrier 200 has a body 210 that includes an elongated strip 220 and a solder-holding conformation 230 that is connected to the elongated strip 220 by means of a neck 240. The body 210, or at least a portion thereof, can be formed by any number of conventional techniques, including forming the body 210 by stamping from a material strip. In accordance with an embodiment of the present invention, the carrier 200 is formed of a non-wettable material, relative to solder, with exemplary non-wettable materials including but not limited to aluminum, a plastic, etc.

The elongated strip 220 includes a plurality of slots or openings 222 that are formed in the strip 220 along a length thereof. In the exemplary embodiment, the openings 222 are formed in the strip 220 at a location where the neck 240 intersects the strip 220. The neck 240 extends from the upper edge 221 of the strip 220 and is integrally connected to the solder-holding conformation 230. The solder-holding conformation 230 has a U-shaped body 232 that is defined by a pair of side walls 234 that are spaced apart from one another so as to define a space 235 therebetween. The neck 240 is connected to a base portion 236 of the body 232, with the side walls 234 extending outwardly therefrom.

The side walls 234 include a feature that permits the solder mass 300 to be held and carried by the solder-holding conformation 230. More specifically, each side wall 234 includes an open notch 237 that is formed along an inner edge 239 of the side wall 234. The notch 237 can have any number of different shapes so long as it can receive and hold an end of solder mass segment 300. For example, the notch 237 can have an arcuate shape, a square shape, a triangular shape, a rectangular shape, etc., with the illustrated notch 237 having a U-shape. The notches 237 are axially aligned to permit the solder mass 300 to be received within the notches 237 and extend across the space 235.

The solder-holding conformation 230 includes a structure, generally indicated at 250, for "Z" axis alignment to the PCB 100 when the carrier 200 is orientated relative to side edge 110 of the PCB 100 for deposing the solder mass 300 into the plated opening 120. The structure 250 is in the form of a pair of tabs or protrusions that acts as an alignment and stop mechanism. More specifically and as illustrated, a lower edge 238 of each side wall 234 includes an elongated protrusion 250 that extends outwardly from the inner edge 239 of the side wall 234. The protrusion (stop) 250 is preferably formed at a right angle to the inner edge 239 such that the protrusion 250 and inner edge 239 form a right angled shoulder. As described below, the spaced protrusions 250 are received along the bottom surface 104 of the PCB 100 and since the edge 110 and the bottom surface 104 are formed at a right angle, they are therefore complementary to the right angle formed between the protrusions 250 and inner edge 239.

The solder-holding conformation 230 also includes a structure 260 for shielding the solder pad 130 from wicking of the solder mass 300 during reflow thereof. The structure 260 is in the form of an integral shield/elongated protrusion that extends outwardly from the upper edge 241 of the side wall 234. The shield 260 thus occupies a significant amount of the area of the space 235 between the side walls 234 at the upper edge 241 thereof. In the illustrated embodiment, the length of the shield 260 is greater than a length of both the protrusions 250 and the side walls 234 and therefore, the shield 260 extends beyond both of these structures. The shield 260 is formed above the notches 237 and therefore, the shield 260 is disposed over the solder mass 300.

Figure 3:
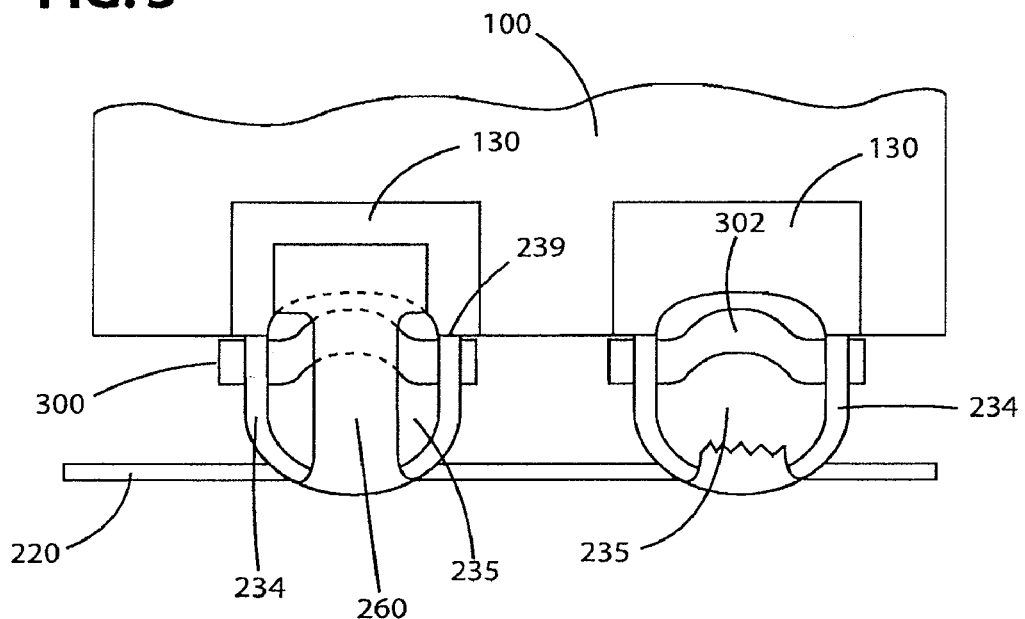
FIG. 3 is a top plan view of the carrier of FIG. 2 aligned with the PCB so that the solder mass aligns with the bisected plated opening.

The use of the carrier 200 for depositing the solder mass 300 into the plated opening 120 of the PCB 100 is described with reference to FIGS. 1-6. The solder mass 300 is held by the solder conformation 230 by placing ends of a solder mass segment 300 within the notches 237 such that the solder mass 300 extends across the space 235. As best shown in FIG. 3, the solder mass 300 can be pre-shaped before insertion or depositing the solder mass 300 into the plated opening 120. For example, the solder mass 300 can be bent in a middle region 302 thereof between the ends of the solder mass 300 so as to form a convex shape that is complementary to the arcuate (e.g., semi-circular) shaped so as to permit the bent portion 302 of the solder mass 300 to be received within the plated opening 120. By forming a bent portion 302, the placement/deposition of the solder mass 300 in the plated opening 120 is made easier.

The carrier 200 is positioned relative to the PCB 100 by aligning the side walls 234 on each side of the plated opening 120 such that the space 235 is aligned with and faces the plated opening 120. In this orientation, the protrusions (stops) 250 are positioned along the bottom surface 104 of the PCB 100 with the edge 110 in contact with or being placed proximate to the inner edge 239 of the side walls 234. The protrusions 250, as well as the inner edge 239, thus serve as locating features that position and orientate the carrier 200 relative to the PCB 100 as shown in FIGS. 3-4.

Figure 4:
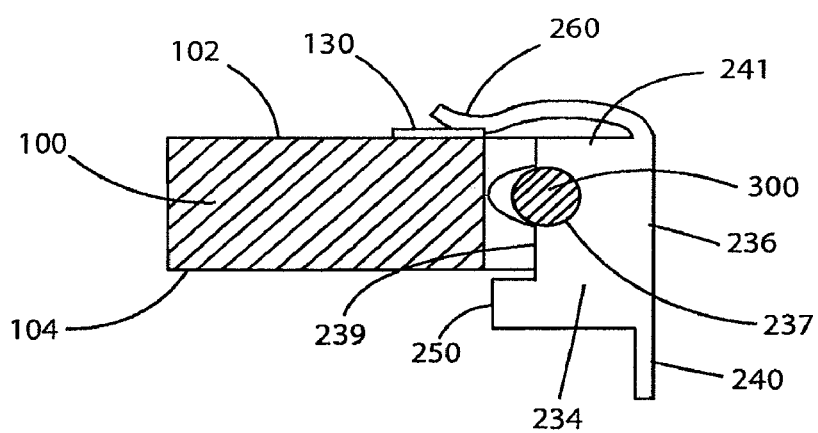
FIG. 4 is an end elevation view of the carrier of FIG. 2 aligned with the PCB so that the solder mass aligns with the bisected plated opening.

As shown in FIGS. 3-4, the shield 260 extends above the solder mass 300 and extends at least partially across the solder pad 130 so as to cover an area of the solder pad 130. In FIG. 3, one of the shields 260 is partially broken away to illustrate the underlying solder mass 300 and the plated opening 120. Once again, when the inner edge 239 seats against the edge 110 of the PCB 100, the solder mass 300, and in particular the bent portion 302, is aligned and deposited into the plated opening 120. The shield 260 is constructed to prevent molten solder (formed by a reflow operation) from wicking onto the planar solder pad 130 that is disposed on the top surface 102 of the PCB 100.

FIGS. 3-4 show the solder mass 300 prior to reflowing the solder mass 300 to cause it to flow into and bond with the plated opening 120 resulting in the addition of solder to plated, solderable structures on the edge 110 of the PCB 100. The solder mass 300 is then reflowed using conventional techniques, such as applying heat to the solder mass 300. The heat can be delivered in any number of forms, including hot air that is directed onto the solder mass 300 or the entire assembly can be subjected to an elevated temperature, causing the solder reflow, so long as the printed circuit board (PCB) 100 is not damaged.

Figure 5:
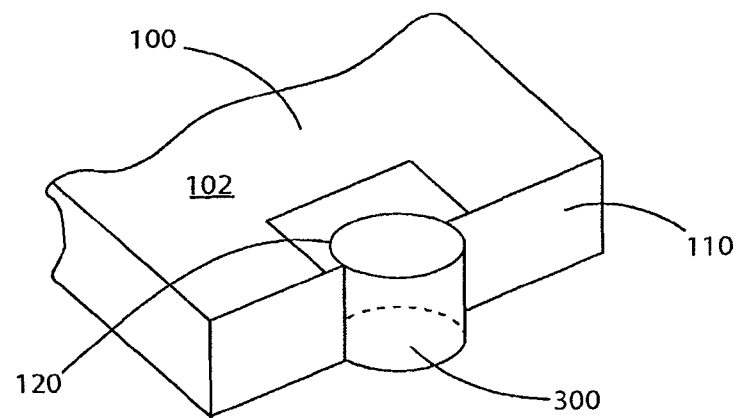
FIG. 5 is a perspective of the PCB of FIG. 1 after the solder mass is deposited into the bisected plated opening and the carrier is removed.

FIG. 5 shows the solder mass 300 deposited in the plated opening 120 after the carrier 200 (FIG. 2) has been removed and at the end of the reflow operation. It will be appreciated that during reflow, the solder mass 300 flows into the arcuate (semi-circular) shaped plated opening 120 and thus, the formed solder deposit has at least a semi-circular shape and more typically, the formed solder deposit has a generally cylindrical shape as shown in FIG. 5. The bonding between the deposited solder mass 300 and the plated opening 120 results in the solder mass 300 being securely held within the plated opening 120 and is ready for later use when it is desired to electrically connect the solder pad 130 with another electronic component via the bisected plated opening 120 located at the edge 110.

Figure 6:
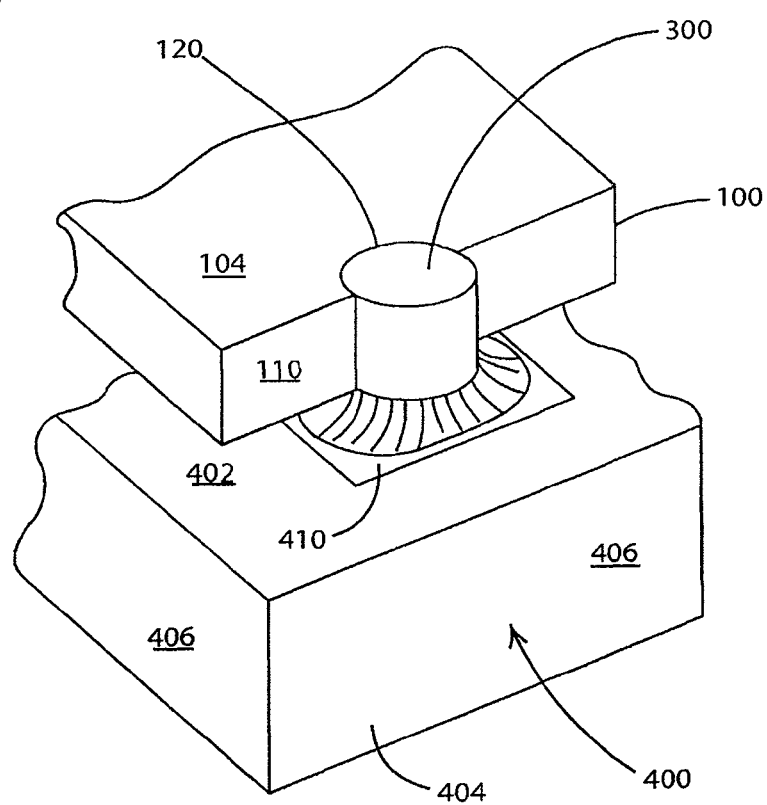
FIG. 6 is a top perspective view of the PCB of FIG. 1 electrically connected to another electronic device by means of reflowing the solder mass.

For example, FIG. 6 shows one exemplary application for the PCB 100 with one or more solder masses 300 deposited along edge 110 within the bisected plated opening 120. In particular, the PCB 100, and in particular, the solder pad 130 thereof, is electrically connected to a second electronic component 400. In the illustrated embodiment, the second electronic component 400 is in the form of a substrate, such as another PCB assembly, that includes a top surface 402, a bottom surface 404 and a peripheral side wall 406 that extends between the top surface 404 and the bottom surface 404. The construction of the PCB 400 can be similar or identical to the construction of the PCB 100 and in any event, the PCB 400 includes a number of electronic components 410 formed thereon. For example, the top surface 402 of the PCB 400 can have one or more conductive pads (solder pads) 410 formed thereon that are designed to be electrically connected to electronic components associated with the other electronic device. More specifically, the solder pad 130 of the PCB 100 is to be electrically connected to the solder pad 410 of the PCB 400.

The PCB 100 and the secondary PCB 400 represent planar substrates that have complementary planar surfaces to permit one substrate to seat against the other substrate. For example, the PCB 100 as shown in FIG. 5 can be inverted and the top surface 102 of the PCB 100 can seat against the top surface 402 of the secondary PCB 400 such that at least a portion of the solder pad 130 is in contact with least a portion of the solder pad 410 of the PCB 400 to establish an electrical connection therebetween. In this orientation, the solder mass 300 likewise lies above and in contact with the solder pad 410. To electrically connect the two electronic components (conductive pads 130, 410), the solder mass 300 is reflowed to provide and form a robust, filleted solder joint between the two PCBs 100, 400 which was otherwise not possible with a one-dimensional planar PCB solder pad (e.g., solder pad 130) using conventional soldering techniques.

Thus, one embodiment of the present invention provides a mechanism for SMT (surface mount technology) attachment of one PCB 100 to another PCB 400 by using conventional PCB solder pads 130, 410 that are connected to a perpendicular bisected plated opening and conventional SMT component attachment methods. The use of a perpendicular bisected plated opening (BPO)-PCB solder joint according to the present invention permits a solder joint and an electrical connection between two electronic components (solder pads) that were otherwise not possible.

More specifically and according to the present invention, the formation of this type of BPO-PCB solder joint is possible due to the addition of solder only on the edge of the PCB and on the inside of the bisected plated opening (through hole). The present method thus provides a device and means for effectively depositing solder only on the inside of the bisected plated opening on the edge of the PCB which has a common solderable surface with the solder pad.

While the invention has been particularly shown and described with reference to preferred embodiments thereof, it will be understood by those skilled in the art that various changes in form and details may be made therein without departing from the spirit and scope of the invention.

What is claimed is:

1. A method for electrically connecting a first electronic device to a second electronic device, the first electronic device having a side edge and first and second faces generally perpendicular to the side edge, a first conductive area formed on the first face thereof, and a plated opening formed along the side edge of the first electronic device, the plated opening being electrically coupled to the first conductive area, the second electronic device having a first surface that includes a second conductive area, the method comprising the steps of:

holding a solder mass having first and second ends in a carrier device that is non-wettable relative to solder, the carrier device having a body portion and at least one alignment member formed as a single piece with the body portion and extending therefrom, the alignment member configured to align the carrier device with respect to the first electronic device when positioned in a predetermined orientation and engaging the first electronic device, wherein the step of holding the solder mass in the carrier device comprises the steps of:

holding the solder mass in a generally U-shaped solder-holding conformation that is formed as one piece with, and as a part of the carrier device, the generally U-Shaped solder-holding conformation having a pair of opposing spaced side walls that extend away from the body of the carrier device, each side wall having an outer edge, the outer edge of each side wall having an open notch formed therein for receiving ends of the solder mass; and depositing the ends of the solder mass in the open notches of the side walls so that the solder mass extends across a space between the side walls;

orienting the carrier device with the alignment member engaging the first electronic device to achieve alignment of the carrier device in a direction perpendicular to the second face of the first electronic device and orienting the carrier device with respect to the side edge of the first electronic device such that the solder mass is adjacent to the plated opening;

reflowing the solder mass to cause the solder mass to be deposited and securely held within the plated opening;

removing the carrier device and leaving the solder mass within the plated opening along the side edge of the first electronic device;

aligning the first electronic device with respect to the second electronic device with the first and second conductive areas adjacent to one another; and reflowing the deposited solder mass in the plated opening to form a filleted solder joint between the first and second conductive areas resulting in the first and second electronic devices being electrically connected.

2. The method of claim 1, wherein each side wall includes an alignment member extending therefrom, the method further comprising the step of:

orienting the generally U-shaped solder-holding conformation relative to the side edge of the first electronic device so that an edge of each of said alignment members is abutting the second face of the first electronic device and the outer edge of each side wall is abutting the side edge of the first electronic device to align the solder mass with respect to the plated opening in the side edge of the first electronic device in at least two directions.

3. The method of claim 1, further comprising the step of: bending an inner region of the solder mass between the ends thereof to assist in reception of the solder mass into the plated opening.

4. The method of claim 1, wherein the first and second conductive areas comprise first and second solder pads, respectively.

5. The method of claim 1, wherein the step of aligning the first electronic device with respect to the second electronic device with the first and second conductive areas facing one another comprises the steps of:
inverting the first electronic device from a position where the first conductive area faces upward to facilitate depositing of the solder mass in the plated opening; and
orienting the first and second electronic devices such that the deposited solder mass is disposed over the second conductive area to permit reflow of the deposited solder mass to form the filleted, solder joint.

6. The method of claim 1, wherein the plated opening is formed vertically in the side edge and is defined by an arcuate surface.

7. The method of claim 1 wherein the plated openings intersect the first conductive area at a substantially right angle.

8. A method of depositing a solder mass within a plated opening that is formed in a side edge of an electronic device, the electronic device having first and second faces generally perpendicular to and terminating at the side edge, the first face having a first conductive area adjacent to the side edge, the first conductive area being conductively coupled to the plated opening, the method comprising the steps of:
holding a solder mass having first and second ends in a carrier device that is non-wettable relative to solder, the carrier device having at least one alignment member formed as a single piece with the carrier device and extending from the carrier device;
orienting the carrier device with the at least one alignment member engaging the second face of the first electronic device to align the carrier device with respect to the first electronic device in a direction generally perpendicular to the second face and orienting the carrier device with respect to the side edge such that the solder mass is adjacent to the plated opening;
reflowing the solder mass to cause the solder mass to be deposited and securely held within the plated opening; and
removing the carrier device leaving the solder mass behind within the plated opening and along the side edge of the first electronic device,
wherein the orienting step includes the step of orienting the carrier device with respect to the electronic device such that a shield formed as a single piece with the carrier device is disposed in adjacent opposed relation with respect to the first conductive area for shielding at least a portion of the first conductive area from reflow of the solder mass when the carrier device is disposed in an aligned relation with respect to the electronic device and the solder mass is reflowed.

9. The method of claim 8, wherein the step of holding the solder mass comprises the step of:
holding the solder mass in a transverse direction between two spaced opposing side walls having outer edges, the side walls being part of a solder-holding conformation that is itself part of the carrier device and formed as a single piece therewith, the transverse direction being substantially perpendicular to an axis that extends the length of the plated opening.

10. The method of claim 9, further comprising the steps of:
orienting a pair of alignment members formed as part of the solder-holding conformation relative to the side edge of the electronic device so that one edge of each of the alignment members abuts one of the faces of the electronic device and, the outer edge of each of the side walls is in abutting relation with the side edge of the electronic device.

11. The method of claim 8, further comprising the step of:
pre-shaping an inner region of the solder mass so that it protrudes outwardly to assist in reception of the solder mass into the plated opening.

12. The method of claim 8, wherein the first conductive area is in the form of a solder pad that extends to the side edge and is conductively coupled to the plated opening.

13. The method of claim 8, wherein the plated opening comprises a semi-circular shaped channel formed in the side edge.

14. A method of depositing a solder mass within a plated opening that is formed in a side edge of a substrate having first and second faces generally perpendicular to the side edge, the first face having a first conductive area adjacent the side edge, the first conductive area being conductively coupled to the plated opening, the method comprising the steps of:
holding a solder mass in a carrier device that is non-wettable relative to solder, the carrier device including a body portion and an alignment member extending outward from the body portion, the carrier device, including the body portion and the alignment member, being formed as a single piece;
orienting the carrier device with the alignment member engaging the substrate to align the solder mass in a predetermined position with respect to the plated opening in the side edge of the substrate;
reflowing the solder mass to cause the solder mass to be deposited and securely held within the plated opening; and
removing the carrier device leaving the solder mass behind within the plated opening and along the side edge of the substrate,
wherein the carrier device includes a shield formed as a single piece with the body portion, the method including the step of orienting the carrier device in aligned relation with respect to the side edge of the substrate with at least a portion of the shield disposed over and in confronting relation with at least a portion of the first conductive area of the substrate to shield at least a portion of the first conductive area from wicking of the solder mass thereon during the reflowing step.

15. A method for electrically connecting a first substrate to a second electronic device, the first substrate having first and second faces, a side edge, a first conductive area formed on the first face thereof, and a plated opening formed along the side edge of the substrate, the plated opening being electrically coupled to the first conductive area, the second electronic device having a first surface that includes a second conductive area, the method comprising the steps of:
holding a solder mass in a carrier device that is non-wettable relative to solder, the carrier device including a body portion and an alignment member extending outward from the body portion, the carrier device, including the body portion and the alignment member being formed as a single piece;

positioning the carrier device with the alignment member engaging the first substrate in a predetermined orientation to align the solder mass with respect to the plated opening in the side edge of the substrate;

in a first reflowing step, reflowing the solder mass to cause the solder mass to be deposited and securely held within the plated opening;

removing the carrier device leaving the solder mass behind within the plated opening and along the side edge of the substrate;

aligning the first substrate with respect to the second electronic device with the first and second conductive areas adjacent to one another; and in a second reflowing step, reflowing the deposited solder mass in the plated opening to form a filleted solder joint between the first and second conductive areas resulting in the first substrate and the second electronic device being electrically connected, wherein the carrier device includes a shield formed as a single piece with the body portion, the method including the step of orienting the carrier device in aligned relation with the first substrate with at least a portion of the shield disposed over and in confronting relation with at least a portion of the first conductive area of the first substrate to shield at least a portion of the first conductive area from wicking of the solder mass thereon during the first reflowing step.

16. A method for electrically connecting a first electronic device to a second electronic device, the first electronic device having a side edge and first and second faces generally perpendicular to the side edge, a first conductive area formed on the first face thereof, and a plated opening formed along the side edge of the first electronic device, the plated opening being electrically coupled to the first conductive area, the second electronic device having a first surface that includes a second conductive area, the method comprising the steps of:

holding a solder mass having first and second ends in a carrier device that is non-wettable relative to solder, the carrier device having a body portion and at least one alignment member formed as a single piece with the body portion and extending therefrom, the alignment member configured to align the carrier device with respect to the first electronic device when positioned in a predetermined orientation and engaging the first electronic device;

orienting the carrier device with the alignment member engaging the first electronic device to achieve alignment of the carrier device in a direction perpendicular to the second face of the first electronic device and orienting the carrier device with respect to the side edge of the first electronic device such that the solder mass is adjacent to the plated opening, wherein the carrier device includes a shield formed as a single piece therewith and orienting the carrier device in aligned relation with respect to the first electronic device with at least a portion of the shield disposed in confronting relation and over the first conductive area of the first electronic device, the shield being configured to prevent wicking of solder on at least a portion of the first conductive area when the carrier device is aligned with respect to the first electronic device and the solder mass is reflowed;

reflowing the solder mass to cause the solder mass to be deposited and securely held within the plated opening;

removing the carrier device and leaving the solder mass within the plated opening along the side edge of the first electronic device;

aligning the first electronic device with respect to the second electronic device with the first and second conductive areas adjacent to one another; and reflowing the deposited solder mass in the plated opening to form a filleted solder joint between the first and second conductive areas resulting in the first and second electronic devices being electrically connected.

17. A method of depositing a solder mass having first and second ends within a plated opening that is formed in a side edge of an electronic device, the electronic device having first and second faces generally perpendicular to and terminating at the side edge, the first face having a first conductive area adjacent to the side edge, the first conductive area being conductively coupled to the plated opening, the method comprising the steps of:

inserting the first and second ends of the solder mass into first and second notches formed in two spaced side walls of a solder-holding conformation that is part of a carrier device, the carrier device being non-wettable relative to solder, the side walls having first and second alignment surfaces and formed as a single piece with the carrier device;

holding the first and second ends of the solder mass in the notches of the side walls of the carrier device;

orienting the solder holding conformation of the carrier device relative to the side edge of the electronic device so that the first alignment surfaces engage the second face of the first electronic device to align the carrier device with respect to the first electronic device in a direction generally perpendicular to the second face and, orienting the second alignment surfaces of the two side walls in abutting relation with the side edge of the electronic device with the solder mass adjacent to the plated opening;

shielding at least a portion of the first conductive area from wicking of the solder mass thereon when the solder mass is reflowed with a structure that extends outwardly from the solder-holding conformation along an upper edge thereof and above a location where the solder mass is held;

reflowing the solder mass to cause the solder mass to be deposited and securely held within the plated opening; and removing the carrier device leaving the solder mass behind within the plated opening and along the side edge of the first electronic device.

\* \* \* \* \*